(12) United States Patent
Eom

(10) Patent No.: US 10,748,777 B2
(45) Date of Patent: Aug. 18, 2020

(54) DELAY-ETCHING MEMBER AND DISPLAY PANEL ETCHING METHOD BY MEANS OF SAME

(71) Applicant: TOVIS CO., LTD., Incheon (KR)

(72) Inventor: Gi Yun Eom, Incheon (KR)

(73) Assignee: TOVIS CO., LTD., Incheon (KR)

( * ) Notice: Subject to any disclaimer, the term of this patent is extended or adjusted under 35 U.S.C. 154(b) by 4 days.

(21) Appl. No.: 15/539,143

(22) PCT Filed: Dec. 26, 2014

(86) PCT No.: PCT/KR2014/012909
§ 371 (c)(1),
(2) Date: Jun. 23, 2017

(87) PCT Pub. No.: WO2016/104844
PCT Pub. Date: Jun. 30, 2016

(65) Prior Publication Data
US 2017/0352547 A1    Dec. 7, 2017

(30) Foreign Application Priority Data

Dec. 24, 2014  (KR) .................. 10-2014-0188489

(51) Int. Cl.
| | | |
|---|---|---|
| *H01L 21/306* | (2006.01) | |
| *G02F 1/1333* | (2006.01) | |
| *G02F 1/13* | (2006.01) | |
| *G02F 1/1335* | (2006.01) | |
| *G02F 1/1345* | (2006.01) | |

(52) U.S. Cl.
CPC ...... *H01L 21/30604* (2013.01); *G02F 1/1303* (2013.01); *G02F 1/1333* (2013.01); *G02F 1/1335* (2013.01); *G02F 1/1345* (2013.01); *G02F 1/133305* (2013.01); *G02F 2001/133368* (2013.01); *G02F 2001/133388* (2013.01)

(58) Field of Classification Search
None
See application file for complete search history.

(56) References Cited

U.S. PATENT DOCUMENTS

| 4,523,976 A | * | 6/1985 | Bukhman | ......... H01L 21/31138 |
| | | | | 438/671 |
| 4,950,499 A | * | 8/1990 | Martin | ................. C23C 14/205 |
| | | | | 204/192.14 |

(Continued)

FOREIGN PATENT DOCUMENTS

| KR | 10-2000-0020776 A | 4/2000 |
| KR | 10-2013-0026286 A | 3/2013 |

(Continued)

OTHER PUBLICATIONS

International Search Report for PCT/KR2014/012909 dated Aug. 21, 2015 from Korean Intellectual Property Office.

*Primary Examiner* — Allan W. Olsen
(74) *Attorney, Agent, or Firm* — Revolution IP, PLLC

(57) ABSTRACT

Provided is an etching delay element for forming a protruding portion at an object by shielding part of the object against etching, the etching delay element being attached to a non-etching section of the object corresponding to the protruding portion and being made of a material that is etchable by an etchant.

1 Claim, 6 Drawing Sheets

(56) References Cited

U.S. PATENT DOCUMENTS

| | | | | |
|---|---|---|---|---|
| 5,780,332 A * | 7/1998 | Ozaki | | H01L 27/10832 |
| | | | | 257/E21.653 |
| 6,015,976 A * | 1/2000 | Hatakeyama | | G03F 7/001 |
| | | | | 250/492.22 |
| 6,926,841 B2 * | 8/2005 | O'Brien | | G01J 3/26 |
| | | | | 216/24 |
| 6,930,051 B1 * | 8/2005 | Manginell | | H01L 21/3083 |
| | | | | 257/E21.233 |
| 7,105,098 B1 * | 9/2006 | Shul | | B81C 1/00626 |
| | | | | 216/41 |
| 8,486,287 B2 * | 7/2013 | Zhu | | B81C 1/00111 |
| | | | | 216/41 |
| 9,195,048 B1 * | 11/2015 | Kowarz | | H01Q 15/144 |
| 2003/0071542 A1 * | 4/2003 | Satoh | | C30B 33/00 |
| | | | | 310/367 |
| 2003/0211692 A1 * | 11/2003 | Lee | | H01L 27/105 |
| | | | | 438/258 |
| 2005/0000933 A1 * | 1/2005 | Shiratori | | H01L 21/0332 |
| | | | | 216/12 |
| 2005/0111146 A1 * | 5/2005 | Hoffmann | | B82Y 10/00 |
| | | | | 360/324.2 |
| 2007/0077849 A1 * | 4/2007 | Chen | | H01L 51/5253 |
| | | | | 445/25 |
| 2009/0152663 A1 * | 6/2009 | Tu | | H01L 31/04 |
| | | | | 257/439 |
| 2011/0207238 A1 * | 8/2011 | Horii | | B01L 3/50273 |
| | | | | 436/518 |
| 2011/0207328 A1 * | 8/2011 | Speakman | | H01L 51/0011 |
| | | | | 438/694 |
| 2014/0226111 A1 | 8/2014 | Kim | | |
| 2014/0271277 A1 * | 9/2014 | Whalen | | F04B 43/046 |
| | | | | 417/413.2 |
| 2015/0200105 A1 * | 7/2015 | Langa | | B81C 1/00317 |
| | | | | 438/701 |
| 2015/0221695 A1 * | 8/2015 | Park | | H01L 27/14636 |
| | | | | 257/774 |
| 2017/0214217 A1 * | 7/2017 | Peale | | H01S 5/3401 |
| 2018/0237291 A1 * | 8/2018 | Diao | | B81C 1/00031 |

FOREIGN PATENT DOCUMENTS

| | | |
|---|---|---|
| KR | 10-2013-0086729 A | 8/2013 |
| KR | 10-2014-0037422 A | 3/2014 |
| KR | 10-2014-0053774 A | 5/2014 |
| KR | 10-1437534 B1 | 9/2014 |

* cited by examiner

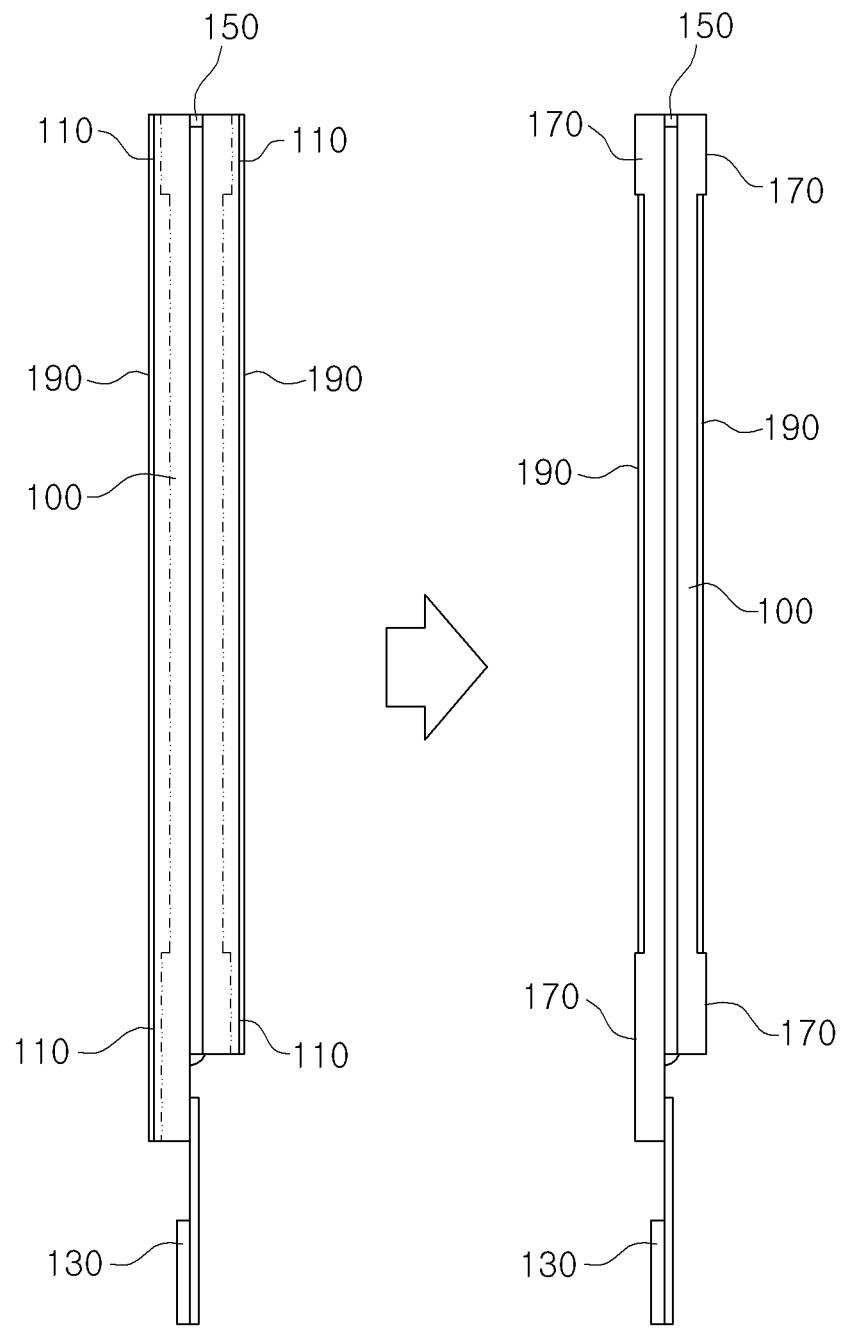
[Fig. 1]

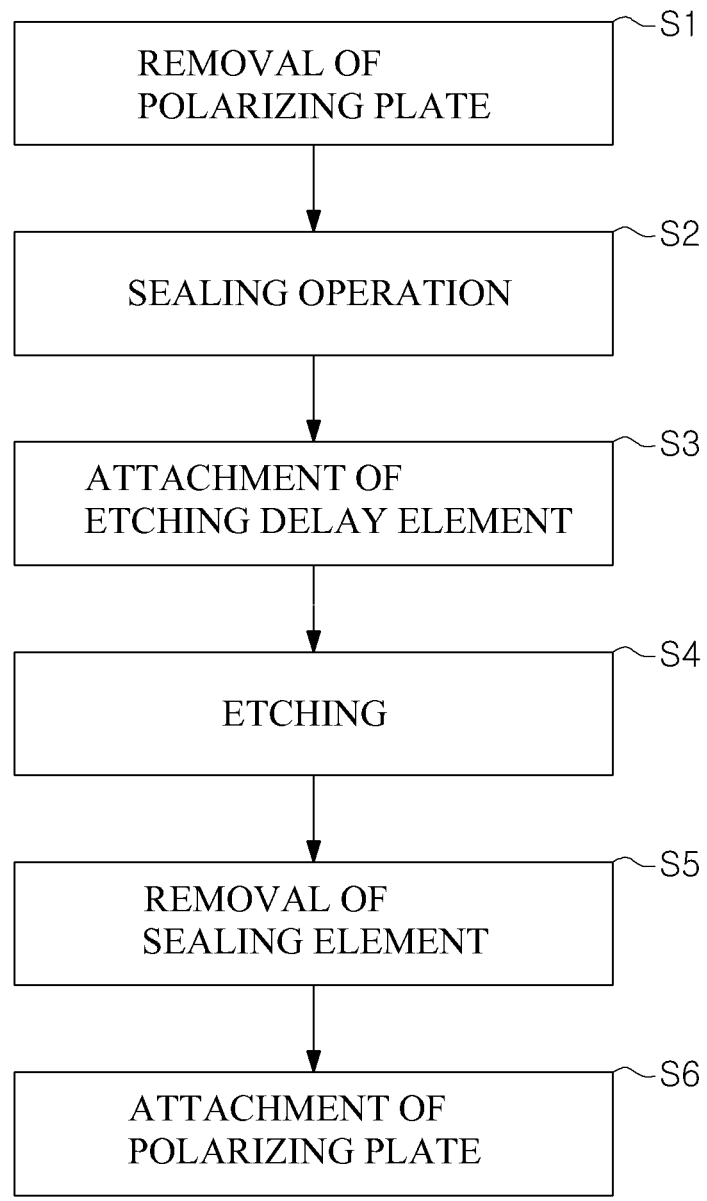

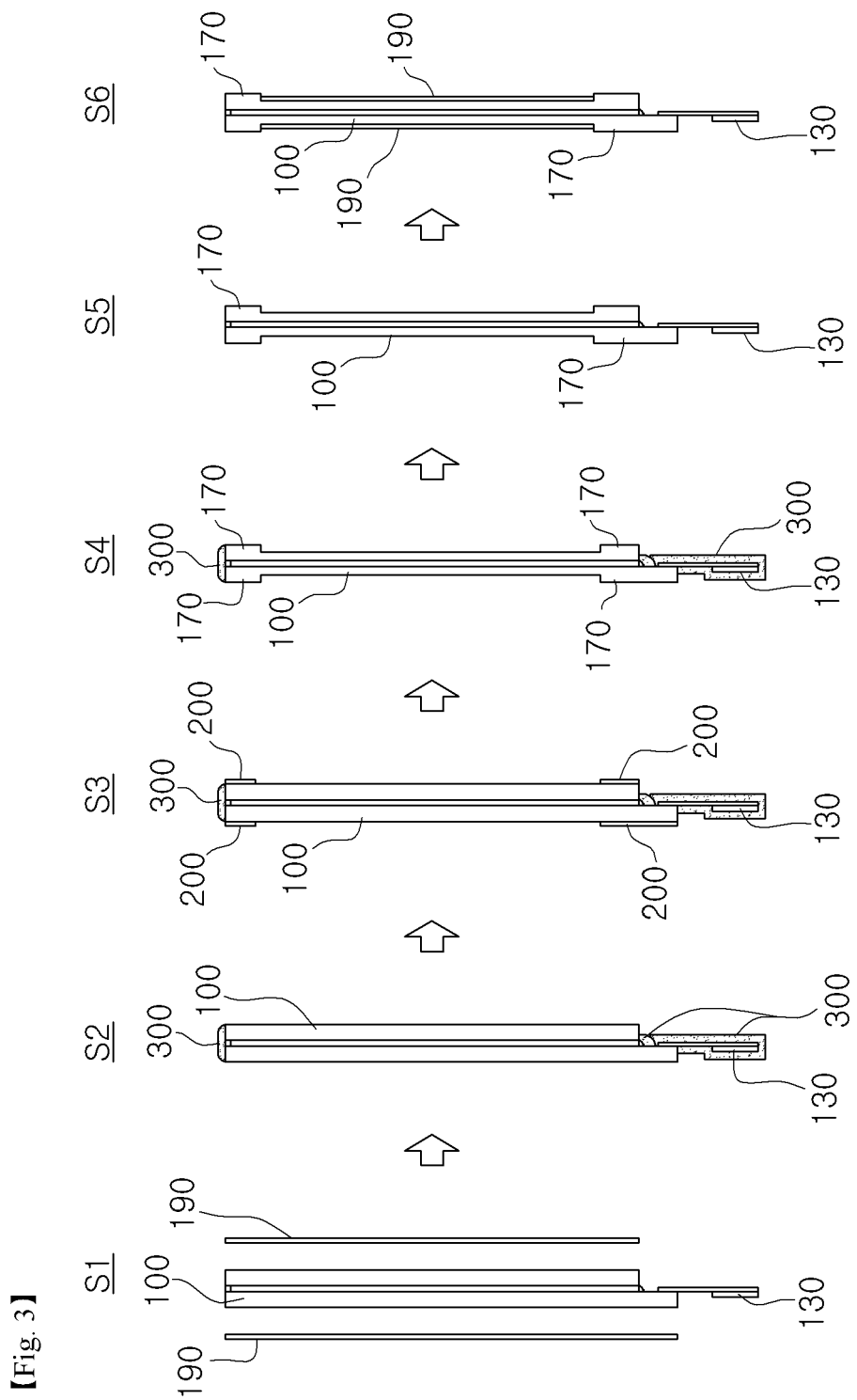
[Fig. 3]

[Fig. 4]
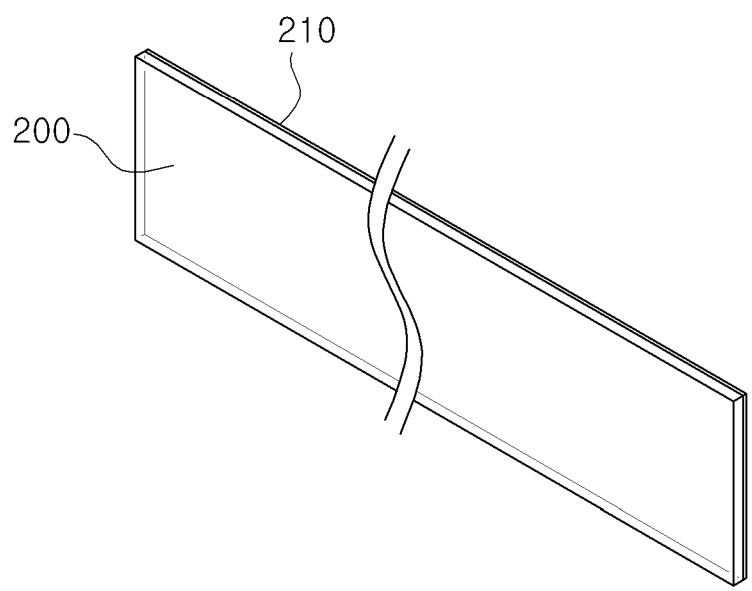

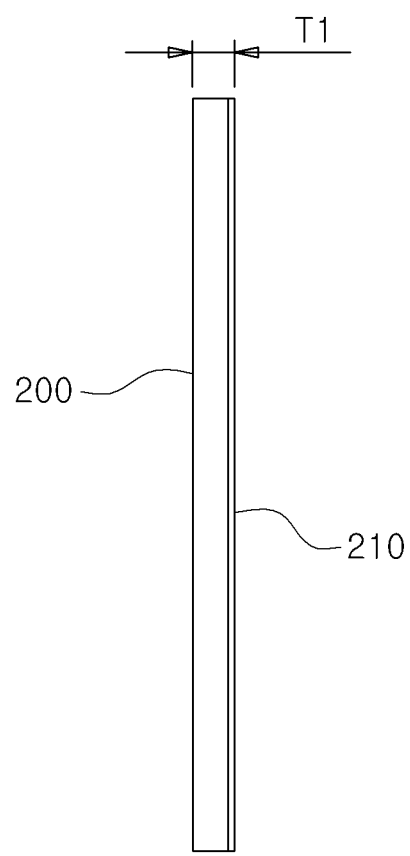
[Fig. 5]

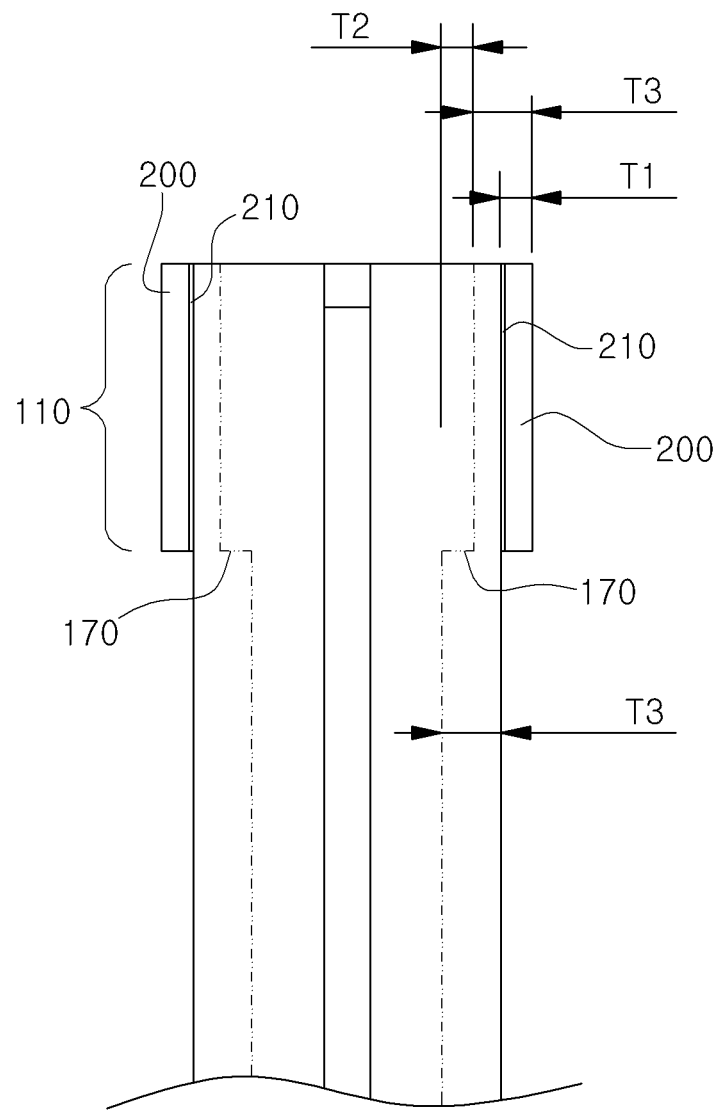

DELAY-ETCHING MEMBER AND DISPLAY PANEL ETCHING METHOD BY MEANS OF SAME

CROSS REFERENCE TO PRIOR APPLICATIONS

This application is a National Stage Application of PCT International Patent Application No. PCT/KR2014/012909 filed on Dec. 26, 2014, under 35 U.S.C. § 371, which claims priority to Korean Patent Application No. 10-2014-0188489 filed on Dec. 24, 2014, which are all hereby incorporated by reference in their entirety.

TECHNICAL FIELD

The present invention relates to a method of etching a display panel to produce a curved display.

BACKGROUND ART

Display devices are designed to display an image. Recently, curved display devices in which a display surface is curved to enhance immersion are being developed.

Such a curved display device is manufactured in such a way that a display panel is curved into a desired shape by reducing a thickness of the display panel. A manufacturer who produces display panels may design a display panel to reduce the thickness thereof in order to manufacture a curved display panel.

However, a manufacturer who does not have capability to produce display panels manufactures a curved display device through a procedure of purchasing a ready-made display panel and then etching the display panel to make the display panel curved.

A conventional method of etching a display panel to produce a curved display device is disclosed in Korean Patent Registration No. 10-1437534 (published on Sep. 15, 2014), entitled "Method of Etching Substrate to Produce Curved Display Panel".

The conventional method of etching a substrate to produce a curved display panel includes forming a protective layer for protecting a region of a display panel in which a liquid crystal layer is formed under the condition that a drive circuit unit is coupled to the display panel, protecting the drive circuit unit against an etchant, masking non-etching sections of first and second substrates, and etching surfaces of the first and second substrates while holding the masked display panel.

The conventional method of etching a substrate to produce a curved display panel performs a masking procedure on non-etching sections to form protrusions and, as such, a slim display panel, which is easily bent by gripping the protrusions and exerting force upon the display panel, may be manufactured.

In the conventional method of etching a substrate to produce a curved display panel, however the masking procedure is performed in such a manner that the non-etching sections are not etched at all by masking elements. As a result, it may be impossible to set a thickness of protrusions to be formed.

Furthermore, when a display panel is etched to have a further reduced thickness, thickness of the protrusions becomes relatively larger, thus causing breakage of regions between the display panel and the protrusions when the display panel is bent.

In addition, since the masking procedure is performed while the non-etching sections are covered with caps, it may be difficult to form protrusions having various shapes. Furthermore, since the masking procedure must be performed a large number of times, a period of time required for etching is increased.

DISCLOSURE

Technical Problem

Therefore, the present invention has been made in view of the above problems, and it is an object of the present invention to provide an etching delay element and a method of etching a display panel using the same, which assure formation of protruding portions having various thicknesses and shapes at an object to be etched by shielding corresponding portions of the object against etching, prevention of excessive projection of protruding portions through adjustment of an etched thickness of the display panel, and reduction of a period of time required for etching by elimination of the need to remove attached masking members after etching.

Technical Solution

In order to accomplish the above objects, an etching delay element according to an aspect of the present invention is constructed to form a protruding portion at an object by shielding part of the object against etching, the etching delay element being attached to a non-etching section of the object corresponding to the protruding portion and being made of a material that is etchable by an etchant.

The material may be the same material as that of a portion of the object that is etched away from the object.

The etching delay element may have the same thickness as that of the protruding portion after the object is etched by the etchant.

The etching delay element may further include an adhesive layer provided at one of opposite surfaces of the etching delay element to assure easy attachment to the object.

The adhesive layer may be made of a material that is etchable by the etchant.

The object may be a display panel.

In order to accomplish the above objects, a method of etching a display panel using an etching delay element according to another aspect of the present invention is constructed to form a protruding portion from a non-etching section of the display panel that is not etched by an etchant, the method including attaching the etching delay element to the non-etching section to form the protruding portion, the etching delay element being etchable by the etchant, and applying the etchant to an entire surface of the display panel, to which the etching delay element is attached, to etch the entire surface, thus reducing thickness of the etching delay element as well as thickness of the display panel.

The method may further include applying an acid-resistant sealing material to a region of the display panel that has to be protected from the etchant.

The method may further include, prior to attaching the etching delay element, removing a polarizing plate attached to the display panel from the display panel.

The method may further include, after applying the etchant to the entire surface of the display panel, removing the sealing material from the display panel.

The method may further include, after applying the etchant to the entire surface of the display panel, removing the etching delay element remaining on the display panel.

The etching delay element may have the same thickness as that of the protruding portion after the object is etched by the etchant.

The material may be the same material as that of a portion of the object that is etched away from the object.

The etching delay element may include an adhesive layer provided at one of opposite surfaces of the etching delay element to assure easy attachment to the object, wherein the adhesive layer is made of a material that is etchable by the etchant.

Advantageous Effects

According to the present invention, protruding portions having various thicknesses may be formed by attaching etching delay elements to non-etching sections, and protruding portions having various shapes may be formed in accordance with shapes of the etching delay elements.

Furthermore, since the etching delay elements are etched away during etching, there is no need to remove the etching delay elements, thus minimizing a period of time required for etching.

In addition, since a thickness of protruding portions is easily set in accordance with a thickness to be etched of an object, excessive projection of the protruding portions may be prevented.

Furthermore, since protruding portions are formed by attaching etching delay elements to non-etching sections, the protruding portions may be easily formed.

DESCRIPTION OF DRAWINGS

FIG. 1 is a side view illustrating a display panel before and after the display panel is subjected to etching by a method of etching a display panel using etching delay elements, according to an embodiment of the present invention.

FIG. 2 is a flowchart illustrating the method of etching a display panel using an etching delay elements, according to the embodiment of the present invention.

FIG. 3 is a view schematically illustrating the method of etching a display panel using etching delay elements, according to the embodiment of the present invention.

FIG. 4 is a perspective view illustrating an etching delay element according to an embodiment of the present invention.

FIG. 5 is a side view illustrating the etching delay element according to the embodiment of the present invention.

FIG. 6 is an enlarged view illustrating a display panel to which the etching delay elements according to the embodiment of the present invention are attached.

DESCRIPTION OF REFERENCE NUMERALS

100: display panel
110: non-etching section
130: drive circuit board
150: sealing material
170: protruding portion
190: polarizing plate
200: etching delay element
210: adhesive layer
300: sealing element
T1: thickness of etching delay element
T2: thickness of protruding portion
T3: etched thickness of display

BEST MODE

Hereinafter, an embodiment of the present invention will be described with reference to the accompanying drawings.

As illustrated in FIG. 1, an object to be etched according to the present invention may be a display panel 100. The display panel 100 may be an LCD panel.

The display panel 100 may be etched such that one or both of opposite surfaces of the display panel 100 have reduced thicknesses. The display panel 100, which has been etched and thus has been reduced in thickness by an etching thickness T3, may be bent to have a desired curved profile, thus producing a curved display panel 100.

The display panel 100, which has been bent to have a curved profile, may be maintained in a curved state by means of a curvature maintaining member having a desired curved shape to have a shape of a curved plate or by means of a marginal frame having a centrally open shape so as to support only the marginal area of the display panel 100.

Alternatively, a curved display device may be manufactured in such a way that the display panel 100, which has been etched but not bent yet, is inserted into a frame case having a desired curved shape, to be bent to conform to the shape of the frame case.

The display panel 100 may include a drive circuit board 130 for driving the display panel 100. The drive circuit board 130 may be bonded to the display panel 100 by means of a flexible cable.

The display panel 100 may be etched except for non-etching sections 110 to form protruding portions 170. Consequently, the display panel 100 may be bent by gripping the protruding portions 170 and then exerting bending force on the display panel 100.

In this context, the non-etching sections 110, which will form the protruding portions 170 later, may be formed entirely or partially along marginal areas of opposite surfaces of the display panel 100. When the non-etching sections 110 are formed partially along the marginal areas, they may be formed at opposite sides of the marginal areas, that is, right and left sides or upper and lower sides of the marginal areas.

The display panel 100 may include polarizing plates 190 attached to outer surfaces thereof. The polarizing plates 190 may be of a film type.

As illustrated in FIGS. 2 and 3, a method of etching a display panel 100 using delay etching, according to an embodiment of the present invention may include an operation of removing polarizing plates 190 (S1).

The operation S1 of removing the polarizing plates 190 is performed to remove the polarizing plates 190 from the display panel 100.

The operation S1 of removing the polarizing plates 190 is performed only in the case where the polarizing plates 190 are attached to the display panel 100. The polarizing plates 190 may not be removed depending on an etching method.

The operation S1 of removing the polarizing plates 190 may be performed just after a sealing operation S2 which will be described below.

As illustrated in FIGS. 2 and 3, the method of etching the display panel 100 using delay etching, according to this embodiment of the present invention may include the sealing operation S2.

The sealing operation S2 is performed so as to seal regions of the display panel 100 which may be etched by an etchant.

The sealing operation S2 may be performed in such a manner as to envelop a drive circuit board 130 attached to the display panel 100 with a sealing element 300. The sealing elements 300 may be embodied as acid-resistant sealing tape having an adhesive layer.

When the display panel 100 is an LCD panel, the sealing operation S2 may be performed in such a manner as to wrap the sealing element 300 around desired peripheral portions of the display panel 100 so as to cover a sealing material 150 serving to seal a liquid crystal layer disposed in the display panel 100. In this case, the sealing elements 300 may be embodied as acid-resistant silicone.

As illustrated in FIGS. 2 and 3, the method of etching the display panel 100 using delay etching, according to this embodiment of the present invention may include an operation of attaching the etching delay elements 200 (S3).

The operation S3 of attaching the etching delay elements 200 is performed in such a manner as to attach the etching delay elements 200 to non-etching sections of the display panel 100 which has to be prevented from etching by an etchant in order to form the protruding portions 170.

The etching delay elements 200 according to this embodiment of the present invention will now be described.

As illustrated in FIGS. 4 to 6, the etching delay elements 200 according to this embodiment of the present invention may be made of a material that is etchable by an etchant, for example, a material that can be completely dissolved by an etchant serving as solvent, and may be configured to have a plate shape. The etching delay elements 200 may be made of the same material as that of regions of an object to be etched, that is, the display panel 100.

The etching delay elements 200 may have a thickness equal to or smaller than an etching thickness T3 by which the display panel 100 will be etched. In this specification, the term "etching thickness" refers to an etching thickness at only one surface of the display panel 100 rather than a total thickness at opposite surfaces of the display panel 100.

When the etching delay elements 200 are configured to have a thickness equal to the thickness T3 by which the display panel 100 is etched, only the etching delay elements 200 disposed on the non-etching sections 110 are completely eliminated after completion of the etching of the display panel 100 and, as such, the non-etching sections 110 remain unetched. As a result, the display panel 100 may be provided with the protruding portions 170 having such a thickness that surfaces of the protruding portions 170 are flush with the corresponding surfaces of the display panel 100 maintained before the etching process.

When the etching delay elements 200 are configured to have a thickness smaller than the etching thickness T3 by which the display panel 100 will be etched, the display panel 100 and the etching delay elements 200 are first etched away, and then both the display panel 100 and the non-etching sections 110, to which the etching delay elements 200 were attached, are etched away. As a result, the display panel 100 may be provided with the protruding portions 170 having such a thickness that surfaces of the protruding portions are lower than the corresponding surfaces of the display panel 100 maintained before the etching process, but higher than the corresponding surfaces of the display panel 100 formed after the etching process.

Meanwhile, when the etching delay elements 200 are configured to have a thickness T1 larger than the etching thickness T3 by which the display panel 100 will be etched, the etching delay elements 200 are not completely eliminated and partially remain, thus involving cumbersome work of eliminating the left etching delay elements 200.

The etching delay elements 200 may have a thickness equal to a thickness T2 of the protruding portions 170 which will be formed on surfaces of the display panel 100 after the etching process. In other words, the thickness T2 of the protruding portions 170 may be set in accordance with the thickness T1 of the etching delay elements 200.

For example, in order to form protruding portions 170 protruding from the etched surfaces of the display panel 100 by 3 mm, etching delay elements 200 having a thickness T1 of 3 mm are attached to the display panel 100. In this case, the non-etching sections 110 of the display panel 100 are etched away together with the remaining surfaces of the display panel 100 after the etching delay elements 200 having the thickness T1 of 3 mm are completely eliminated and, as such, a thickness difference of 3 mm is maintained between the surfaces of the non-etching sections 110 and the surfaces of the display panel 100 until completion of the etching process. Consequently, the display panel 100 which has been completely etched may be provided with protruding portions 170 protruding from the surfaces of the display panel 100 by a thickness of 3 mm.

As described above, since the thickness T2 of the protrusions 170 is determined by the thickness T1 of the etching delay elements 200 functioning to delay etching, the thickness T2 of the protruding portions 170 may be set in accordance with the thickness T1 of the etching delay elements 200.

The etching delay elements 200 according to this embodiment of the present invention may include the adhesive layer 210.

The adhesive layer 210 may be provided at one of opposite surfaces of each etching delay element 200 to allow the etching delay element 200 to be bonded to the display panel 100.

The adhesive layer 210 may be made of a material having adhesive property required for attachment of the etching delay element 200 to the display panel 100 while being etchable by an etchant, for example, a material that may be dissolved by an etchant serving as solvent.

When the etching delay element 200 does not include the adhesive layer 210, the etching delay element 200 may also be bonded to the display panel 100 by means of adhesive. In this case, the adhesive may also be made of a material having adhesive force while being etchable by an etchant, similarly to the adhesive layer 210.

During etching of the display panel 100, the etching delay elements 200 which are attached to respective non-etching sections 110 of the display panel 100 are etched together with the display panel 100 while delaying etching of the non-etching sections 110 such that etching of the non-etching sections 110 is performed later than etching of the remaining surfaces of the display panel 100 or is prevented and, as such, protruding portions 170 protruding from the display panel 100 may be formed.

Each of the etching delay elements 200 may be configured to have the same shape as that of the corresponding non-etching section 110 and may be attached to the corresponding non-etching section 110 so that the corresponding non-etching section 110 is completely shielded by the etching delay element 200. Alternatively, each of the etching delay elements 200 may be composed of a plurality of etching delay element segments. In this case, the etching delay element segments may be attached to the corresponding non-etching section 110 while being connected to one another so that the corresponding non-etching section 110 is shielded by etching delay element segments.

In order to form protruding portions 170 having different thicknesses and various shapes, etching delay elements 200 having different thicknesses may be manufactured to have shapes corresponding to the various shapes of the protruding portions 170 and may be attached to the non-etching sections 110.

As illustrated in FIGS. 2 and 3, the method of etching the display panel 100 using delay etching, according to this embodiment of the present invention may include an etching operation S4.

The etching operation S4 may be performed throughout the entire surfaces of the display panel 100, in which the etching delay elements 200 are attached to the non-etching sections 110 in operation S3 of attaching the etching delay elements 200, so as to reduce a thickness of the display panel 100.

When it is intended to etch the display panel 100 using an etchant to reduce a thickness of the display panel 100, it goes without saying that the an etchant is also applied to the etching delay elements 200 to etch the etching delay elements 200.

The etching operation S4 involves application of an etchant. Application of an etchant may be achieved in a way in which the etchant flows down along opposite surfaces of the display panel 100 from an upper end of the display panel 100 or another way in which the etchant is sprayed onto the opposite surfaces of the display panel 100 while the display panel 100 is in a horizontal or vertical state. Alternatively, both ways may be simultaneously used.

As illustrated in FIGS. 2 and 3, the method of etching the display panel 100 using delay etching, according to this embodiment of the present invention may include an operation S5 of removing the sealing elements 300.

The operation S5 of removing the sealing elements 300 may be performed to remove the sealing elements 300 used in the sealing operation S2.

Operation S5 of removing the sealing elements 300, one or both of the sealing element 300 enveloping the sealing material 150 and the sealing element 300 enveloping the drive circuit board 130 may be removed as necessary.

Furthermore, in operation S5 of removing the sealing elements 300, residues of the etching delay elements 200 which have not been etched in the etching operation S4 may also be removed.

Removal of the residues of the etching delay elements 200 may be performed in such a manner as to further apply the etchant to the residues of the etching delay elements 200 to completely etch away the residues or in such a manner as to forcibly detach the residues of the etching delay elements 200 from the display panel 100.

Meanwhile, removal of the residues of the etching delay elements 200 may be performed only when it is determined based on observation of the etched display panel 100 that residues of the etching delay elements 200 remain on the display panel 100.

As illustrated in FIGS. 2 and 3, the method of etching the display panel 100 using delay etching, according to this embodiment of the present invention may include an operation S6 of attaching the polarizing plates 190.

In operation S6 of attaching the polarizing plates 190, the polarizing plates 190 may be attached to the display panel 100 when there is no polarizing plate 190 attached to the display panel 100.

In this case, each polarizing plate 190 may be the polarizing plate 190 that has been removed in the operation of removing the polarizing plates 190 or may be a separate polarizing plate 190. The polarizing plate 190 may be attached to one or both of the opposite surfaces of the display panel 100.

Operation S6 of attaching the polarizing plates 190 may be performed immediately before or after the operation S5 of removing the sealing elements 300. The polarizing plates 190 may be attached after the display panel 100 is bent for the production of a curved display panel 100.

After the display panel 100 is completely etched through the method of etching the display panel 100 using the etching delay elements 200, according to this embodiment of the present invention, the display panel 100 may be bent into a desired curved shape while the protruding portions 170 resulting from the non-etching sections 110 are gripped and, as such, a curved display panel 100 may be manufactured.

In order to maintain the curved display panel 100 in a curved state, a curvature maintaining member which was previously bent into a desired curved shape may be attached to the display panel 100, or the display panel 100 may be inserted into a curved marginal frame. As a result, the curved display panel 100 may be obtained.

According to the present invention, since the etching delay elements 200 are etched away along with the display panel 100 by the etchant, there is no need to remove the etching delay elements 200, thus reducing a period of time required for etching of the display panel 100.

Furthermore, the protruding portions 170 may be easily formed merely by attaching the etching delay elements 200 to the display panel 100.

In addition, since thickness T2 of the protruding portions 170 is set in accordance with the thickness T1 of the etching delay elements 200, the protruding portions 170 may have various thicknesses, and shapes of the protruding portions 170 may be set in accordance with shapes of the etching delay elements 200 and, as such, protruding portions 170 may have various shapes.

Furthermore, since the thickness T2 of the protruding portions 170 may be set in accordance with the etching thickness T3 of the display panel 100, it may be possible to prevent breakage of regions between the protruding portions 170 and surfaces of the display panel 100 caused by excessive projection of the protruding portions 170.

Although preferred embodiments of the present invention have been described for illustrative purposes, it is to be understood that the invention is not limited thereto and the scope of the invention encompasses various modifications and variations that may be easily achieved by those skilled in the art.

INDUSTRIAL APPLICABILITY

The present invention may be advantageously applied to the industries concerning wet etching of objects such as glass plates, substrates and display panels.

The invention claimed is:

1. A delay etching element rendering a display panel being bendable and curvable, comprising:
   an adhesive layer provided at one of opposite surfaces of the delay etching element, the adhesive layer etched by an etchant as the delay etching element is attached to a non-etching section of the display panel,
   wherein a protruding portion of the display panel is formed by attaching the delay etching element to the non-etching section of the display panel, the delay etching element made of a material that is the same material as an etching section of the display panel,
wherein the etchant etches the delay etch element along with the adhesive layer and the etching section of the display panel.

\* \* \* \* \*